US011782337B2

(12) United States Patent
Xiao et al.

(10) Patent No.: US 11,782,337 B2
(45) Date of Patent: Oct. 10, 2023

(54) MULTILAYER EXTREME ULTRAVIOLET REFLECTORS

(71) Applicant: Applied Materials, Inc., Santa Clara, CA (US)

(72) Inventors: Wen Xiao, Singapore (SG); Herng Yau Yoong, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 17/470,624

(22) Filed: Sep. 9, 2021

(65) Prior Publication Data

US 2023/0075471 A1    Mar. 9, 2023

(51) Int. Cl.
*G03F 1/24* (2012.01)

(52) U.S. Cl.
CPC ..................... *G03F 1/24* (2013.01)

(58) Field of Classification Search
CPC ........................................................ G03F 1/24
USPC ............................................................ 430/5
See application file for complete search history.

(56) References Cited

U.S. PATENT DOCUMENTS

| | | | |
|---|---|---|---|
| 4,410,407 | A | 10/1983 | Macaulay |
| 5,944,967 | A | 8/1999 | Kunz et al. |
| 6,132,566 | A | 10/2000 | Hofmann et al. |
| 6,323,131 | B1 | 11/2001 | Obeng et al. |
| 6,449,086 | B1 | 9/2002 | Singh |
| 6,818,361 | B2 | 11/2004 | Yan |
| 8,587,662 | B1 | 11/2013 | Moll |
| 8,691,476 | B2 | 4/2014 | Yu et al. |
| 8,802,335 | B2 | 8/2014 | Oh et al. |
| 8,932,785 | B2 | 1/2015 | Utzny |
| 9,329,597 | B2 | 5/2016 | Stoschek et al. |
| 9,580,796 | B2 | 2/2017 | Ritchie et al. |
| 9,612,522 | B2 | 4/2017 | Hassan et al. |
| 9,812,303 | B2 | 11/2017 | Ritchie et al. |
| 10,209,411 | B2 | 2/2019 | Goehnermeier et al. |
| 10,481,484 | B2 | 11/2019 | Ikebe et al. |
| 2003/0019739 | A1 | 1/2003 | Shibamoto et al. |
| 2003/0091910 | A1 | 5/2003 | Schwarzl et al. |
| 2003/0147058 | A1 | 8/2003 | Murakami et al. |
| 2003/0203289 | A1 | 10/2003 | Yan et al. |
| 2004/0151988 | A1 | 8/2004 | Silverman |
| 2004/0213971 | A1 | 10/2004 | Colburn et al. |
| 2005/0084773 | A1 | 4/2005 | Krauth |
| 2005/0133365 | A1 | 6/2005 | Hong et al. |
| 2005/0186485 | A1 | 8/2005 | Yoshikawa et al. |
| 2005/0227152 | A1 | 10/2005 | Yan et al. |
| 2006/0008711 | A1 | 1/2006 | Endo |
| 2006/0029866 | A1 | 2/2006 | Schwarzl et al. |
| 2006/0251973 | A1 | 11/2006 | Takaki et al. |
| 2007/0020903 | A1 | 1/2007 | Takehara et al. |
| 2008/0070128 | A1 | 3/2008 | Wu et al. |
| 2008/0248409 | A1 | 10/2008 | Ishibashi et al. |
| 2008/0259439 | A1 | 10/2008 | Shiraishi |
| 2009/0130569 | A1 | 5/2009 | Quesnel |
| 2010/0167181 | A1 | 7/2010 | Kim |
| 2011/0020737 | A1 | 1/2011 | Kamo et al. |
| 2011/0104595 | A1 | 5/2011 | Hayashi et al. |
| 2011/0168545 | A1 | 7/2011 | Shibamoto |
| 2012/0069311 | A1 | 3/2012 | Schwarzl et al. |
| 2012/0088315 | A1 | 4/2012 | Merelle et al. |
| 2012/0129083 | A1 | 5/2012 | Yoshimori et al. |
| 2012/0322000 | A1 | 12/2012 | Uno et al. |
| 2013/0100428 | A1 | 4/2013 | Ruoff et al. |
| 2013/0162726 | A1 | 6/2013 | Mizukami et al. |
| 2013/0217238 | A1 | 8/2013 | Boussie et al. |
| 2013/0323626 | A1 | 12/2013 | Chang |
| 2014/0051015 | A1 | 2/2014 | Gallagher |
| 2014/0192335 | A1 | 7/2014 | Hagio et al. |
| 2014/0212794 | A1 | 7/2014 | Maeshige et al. |
| 2014/0218713 | A1 | 8/2014 | Lu et al. |
| 2014/0254001 | A1 | 9/2014 | Sun et al. |
| 2014/0254018 | A1 | 9/2014 | Sun et al. |
| 2014/0254890 | A1 | 9/2014 | Bergman |
| 2014/0268080 | A1 | 9/2014 | Beasley et al. |
| 2014/0271081 | A1 | 9/2014 | Lavitsky et al. |
| 2014/0272684 | A1 | 9/2014 | Hofmann et al. |
| 2015/0064611 | A1 | 3/2015 | Shih |
| 2015/0205298 | A1 | 7/2015 | Stoschek et al. |

(Continued)

FOREIGN PATENT DOCUMENTS

| | | | |
|---|---|---|---|
| JP | S6376325 | A | 4/1988 |
| JP | 2001085332 | A | 3/2001 |

(Continued)

OTHER PUBLICATIONS

"Extended European Search Report in EP15819417.5 dated Nov. 2, 2017, 11 pages".
"Machine Translation of JP2001085332(A)".
"PCT International Search Report and Written Opinion in PCT/US2020/020031 dated Jun. 30, 2020, 12 pages".
"U.S. Appl. No. 17/349,177, filed Jun. 16, 2021, 54 pages".
Braun, Stefan , et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale, 3 pages".
Jadhav, Sushilkumar A., "Self-assembled monolayers (SAMs) of carboxylic acids: an overview", Central European Journal of Chemistry, pp. 369-378.

(Continued)

*Primary Examiner* — Christopher G Young
(74) *Attorney, Agent, or Firm* — Servilla Whitney LLC (57) ABSTRACT

Extreme ultraviolet (EUV) mask blanks, methods of forming EUV mask blanks and production systems therefor are disclosed. The EUV mask blanks comprise a multilayer reflective stack on a substrate. The multilayer reflective stack comprises a trilayer film including a first film, a second film, and a third film. Some EUV mask blanks include an interface layer on one or more of the first film, the second film and the third film. EUV mask blanks described herein have low $Z_{eff}$ and high reflectance over large bandwidth of reflection angle, thereby minimizing the M3D effect, especially for high-NA EUV scanners.

20 Claims, 5 Drawing Sheets

(56) References Cited

U.S. PATENT DOCUMENTS

| | | |
|---|---|---|
| 2015/0212402 A1 | 7/2015 | Patil |
| 2015/0262797 A1 | 9/2015 | Ishihara et al. |
| 2015/0279635 A1 | 10/2015 | Subramani et al. |
| 2015/0331307 A1 | 11/2015 | Lu et al. |
| 2016/0011344 A1 | 1/2016 | Beasley et al. |
| 2016/0011499 A1 | 1/2016 | Hassan et al. |
| 2016/0011500 A1 | 1/2016 | Hassan et al. |
| 2016/0011502 A1 | 1/2016 | Hofmann et al. |
| 2016/0054488 A1 | 2/2016 | Kandaka |
| 2016/0147138 A1 | 5/2016 | Shih et al. |
| 2016/0161839 A1 | 6/2016 | Lu et al. |
| 2016/0196485 A1 | 7/2016 | Patterson et al. |
| 2016/0357100 A1 | 12/2016 | Ikuta |
| 2017/0053784 A1 | 2/2017 | Subramani et al. |
| 2017/0062210 A1 | 3/2017 | Visser et al. |
| 2017/0092533 A1 | 3/2017 | Chakraborty et al. |
| 2017/0140920 A1 | 3/2017 | Arnepalli et al. |
| 2017/0115555 A1 | 4/2017 | Hofmann et al. |
| 2017/0131627 A1 | 5/2017 | Hassan et al. |
| 2017/0136631 A1 | 5/2017 | Li et al. |
| 2017/0160632 A1 | 6/2017 | Hassan et al. |
| 2017/0178877 A1 | 6/2017 | Wang et al. |
| 2017/0235217 A1 | 8/2017 | Qi et al. |
| 2017/0256402 A1 | 9/2017 | Kaufman-Osborn et al. |
| 2017/0351169 A1 | 12/2017 | Yu et al. |
| 2018/0031964 A1 | 2/2018 | Jindal |
| 2018/0031965 A1 | 2/2018 | Jindal |
| 2018/0291500 A1 | 10/2018 | Wang et al. |
| 2019/0004420 A1 | 1/2019 | Ozawa et al. |
| 2019/0088456 A1 | 3/2019 | Behara et al. |
| 2019/0382879 A1 | 12/2019 | Jindal et al. |
| 2020/0277698 A1 | 9/2020 | Jindal et al. |
| 2021/0132487 A1 | 5/2021 | Shin et al. |

FOREIGN PATENT DOCUMENTS

| | | |
|---|---|---|
| JP | 2007114336 A | 5/2007 |
| JP | 2009099931 A | 5/2009 |
| JP | 2012503318 A | 2/2012 |
| JP | 5045144 B2 | 10/2012 |
| JP | 2013120868 A | 6/2013 |
| JP | 2018085332 A1 | 5/2018 |
| KR | 20070036519 A | 4/2007 |
| KR | 20080001023 A | 1/2008 |
| KR | 20110050427 A | 5/2011 |
| KR | 20110120785 A | 11/2011 |
| KR | 20160002332 A | 1/2016 |
| KR | 20170021190 A | 2/2017 |
| WO | 2013152921 A1 | 10/2013 |
| WO | 2016007613 A1 | 1/2016 |
| WO | 2018156452 A1 | 8/2018 |

OTHER PUBLICATIONS

Snow, A. W., et al., "Packing density of HS(CH2)nCOOH self-assembled monolayers", Analyst, 2011, 136, 4935, 4935-4949.

Van Setten, Eelco, et al., "Multilayer optimization for high-NA EUV mask3D suppression", Proc. of SPIE, vol. 11517, Extreme Ultraviolet Lithography 2020, 12 pages.

Wood, Obert, et al., "Improved Ru/Si multilayer reflective coatings for advanced extreme ultraviolet lithography photomasks", Photomask, BACUS News, Jun. 2016, vol. 32, Issue 6, 1-11.

Zon, Jerzy, et al., "Synthesis of Phosphonic Acids and Their Esters as Possible Substrates for Reticular Chemistry", 2012, RCS publishing, Chapter 6, total pp. 36. (Year: 2012).

English Translation of KR20070036519 (A).

PCT International Search Report and Written Opinion in PCT/US2022/042304 dated Dec. 23, 2022, 8 pages.

MULTILAYER EXTREME ULTRAVIOLET REFLECTORS

TECHNICAL FIELD

The present disclosure generally relates to extreme ultraviolet lithography. More particularly, the disclosure relates to extreme ultraviolet mask blanks comprising a multilayer reflective stack having a trilayer film.

BACKGROUND

Extreme ultraviolet (EUV) lithography is used for the manufacture of 0.0135 micron and smaller minimum feature size semiconductor devices. Through the use of a series of mirrors, or lens elements, and a reflective element, or mask blank, coated with a non-reflective absorber mask pattern, the patterned light is reflected onto a resist-coated semiconductor substrate.

Figure 1:
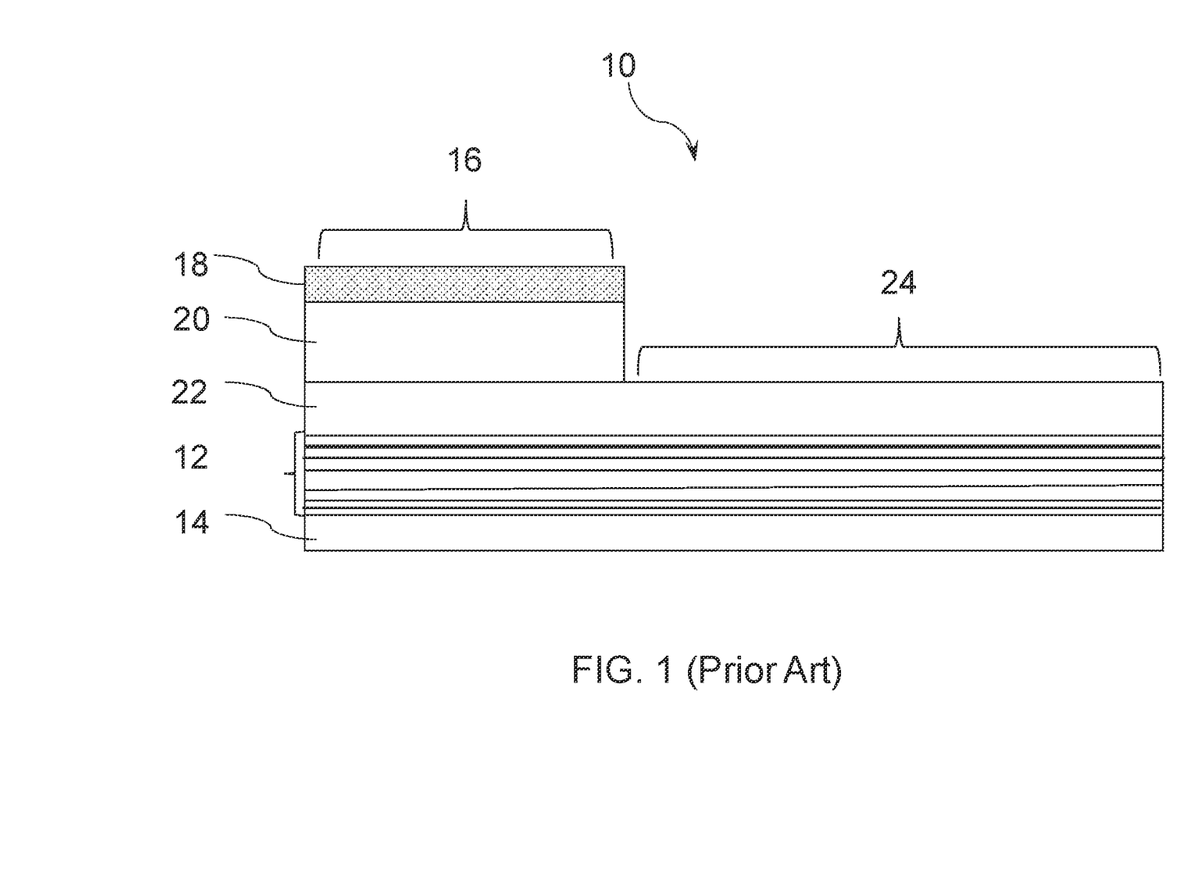
FIG. 1 schematically illustrates a background art EUV reflective mask employing a conventional absorber.

The lens elements and mask blanks of extreme ultraviolet lithography systems are coated with reflective multilayer coatings of materials such as molybdenum and silicon. FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective mask 10 are formed by etching buffer layer 18 and absorbing layer 20. A capping layer 22 is formed over the reflective multilayer stack 12 and protects the reflective multilayer stack 12 during the etching process. An etched mask blank has (non-reflective) areas 16 and reflective areas 24.

The effective mirror plane of the multilayer reflector is a distance away from the absorber due to light penetration into multilayer stack, which known as Z-effect ($Z_{eff}$). The $Z_{eff}$ causes phase change of reflected light and double diffraction of EUV light on patterned absorber. The double diffraction results in additional diffracted light falling inside numerical aperture (NA) of the reflector, and hence causes what is referred to as the mask 3D (M3D) effect, such as non-telecentricity, edge placement error through focus, best focus variation through feature and contrast loss through fading.

Accordingly, there is a need to provide EUV mask blanks having multilayer reflective stacks having low $Z_{eff}$ and high reflectance over large bandwidth of reflection angle minimize the M3D effect, especially for high-NA EUV scanners. In addition, the multilayer reflective stack must meet other requirements for EUV mask blanks, including roughness, uniformity, stress and thermal stability.

SUMMARY

One or more embodiments of the disclosure are directed to an extreme ultraviolet (EUV) mask blank comprising a multilayer reflective stack on a substrate. The multilayer reflective stack comprises a trilayer film comprising a first film comprising an element selected from the group consisting of silicon (Si), boron (B), yttrium (Y), barium (Ba) and zirconium (Zr), a second film comprising an element selected from the group consisting of ruthenium (Ru), palladium (Pd), iridium (Ir), platinum (Pt) and gold (Au), and a third film comprising a metal selected from the group consisting of molybdenum (Mo), niobium (Nb), tungsten (W), manganese (Mn) and titanium (Ti).

Additional embodiments are directed to an extreme ultraviolet (EUV) mask blank comprising a multilayer reflective stack on a substrate. The multilayer reflective stack comprises a trilayer film comprising a first film comprising an element selected from the group consisting of silicon (Si), boron (B), yttrium (Y), barium (Ba) and zirconium (Zr), a second film comprising an element selected from the group consisting of ruthenium (Ru), palladium (Pd), iridium (Ir), platinum (Pt) and gold (Au), and a third film comprising a metal selected from the group consisting of molybdenum (Mo), niobium (Nb), tungsten (W), manganese (Mn) and titanium (Ti). The EUV mask blank further comprises an interface layer on one or more of the first film, the second film, and the third film. The interface layer comprises one or more of silicon nitride ($Si_xN_y$), silicon carbide ($Si_xC_y$), boron nitride ($B_xN_y$), boron carbide ($B_xC_y$), aluminum nitride ($Al_xN_y$), aluminum silicide ($Al_xSi_y$), molybdenum silicide ($Mo_xSi_y$), ruthenium silicide ($Ru_xSi_y$), molybdenum nitride ($Mo_xN_y$), and ruthenium nitride ($Ru_xN_y$).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements. The term "directly on" indicates that there is direct contact between elements with no intervening elements. As used in this specification and the appended claims, the terms "precursor", "reactant", "reactive gas" and the like are used interchangeably to refer to any gaseous species that react with the substrate surface. As used in this specification and the appended claims, the terms "reflective multilayer stack", "multilayer reflective stack", "multilayer stack of reflective layers" are used interchangeably to refer to a reflective element such as an EUV mask blank.

Those skilled in the art will understand that the use of ordinals such as "first" and "second" to describe process regions do not imply a specific location within the processing chamber, or order of exposure within the processing chamber. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate means both a bare substrate and a substrate with one or more films or features deposited or formed thereon.

Figure 2:
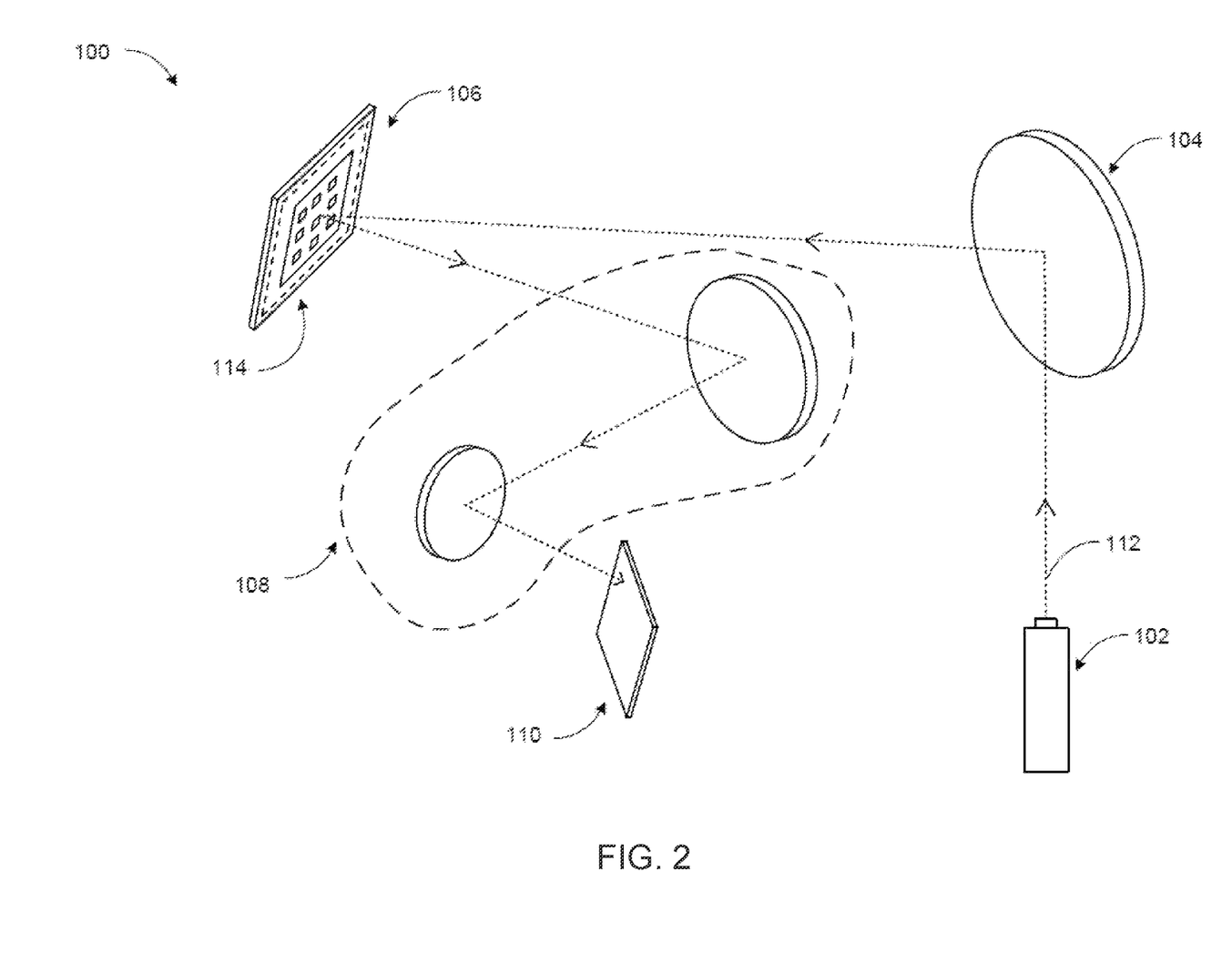
FIG. 2 schematically illustrates an embodiment of an extreme ultraviolet lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm. In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106. Although the condenser 104 is shown as a single element, it is understood that the condenser 104 in some embodiments includes one or more reflective elements such as concave mirrors, convex mirrors, flat mirrors, or a combination thereof, for reflecting and concentrating the extreme ultraviolet light 112. For example, the condenser 104 in the embodiment shown is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 of some embodiments includes mirrors and other optical elements to reduce the size of the image of the mask pattern 114. For example, the optical reduction assembly 108 in some embodiments includes concave mirrors for reflecting and focusing the extreme ultraviolet light 112.

The optical reduction assembly 108 reduces the size of the image of the mask pattern 114 on the target wafer 110. For example, the mask pattern 114 is imaged at a 4:1 ratio by the optical reduction assembly 108 on the target wafer 110 to form the circuitry represented by the mask pattern 114 on the target wafer 110. The extreme ultraviolet light 112 scans the EUV reflective mask 106 synchronously with the target wafer 110 to form the mask pattern 114 on the target wafer 110.

Figure 3:
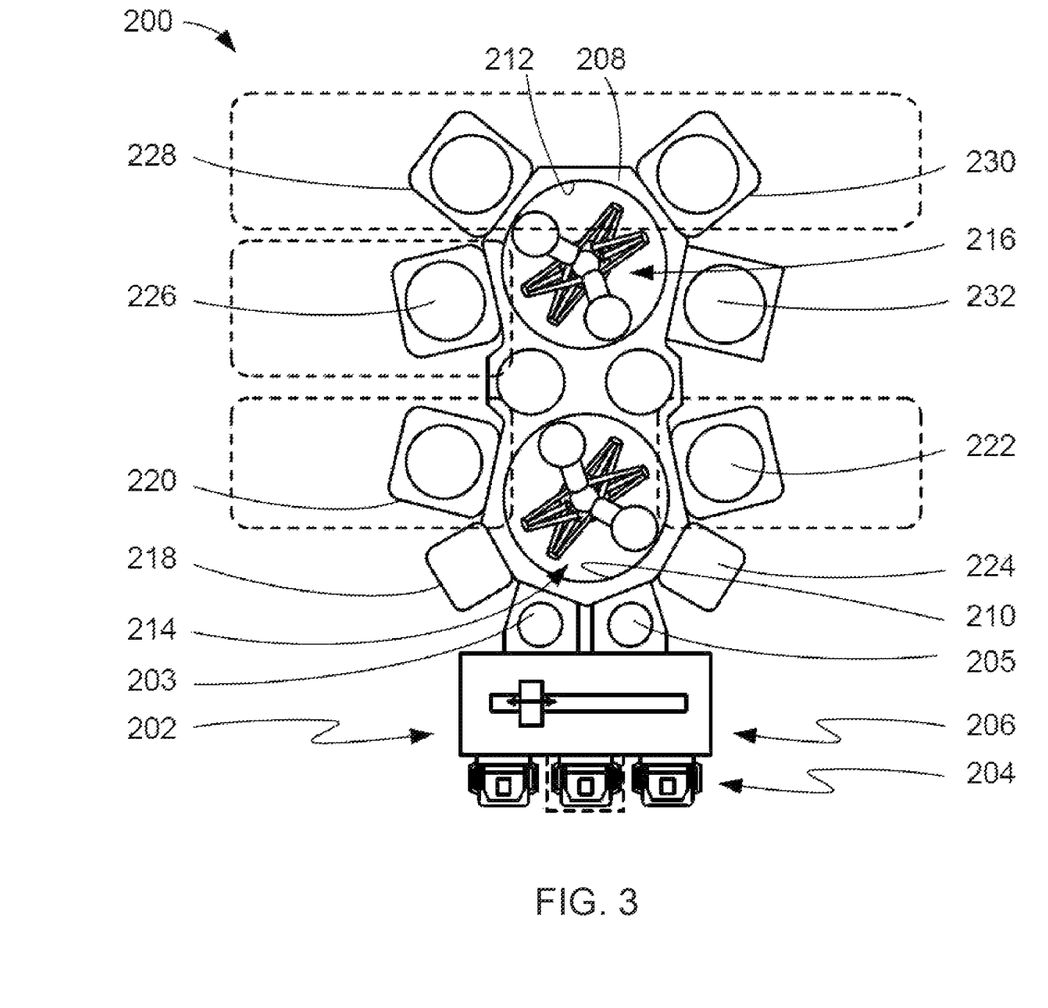
FIG. 3 illustrates an embodiment of an extreme ultraviolet reflective element production system.

Referring now to FIG. 3, an embodiment of an extreme ultraviolet reflective element production system 200 is shown. The extreme ultraviolet reflective element includes an EUV mask blank 204, an extreme ultraviolet mirror 205, or other reflective element such as an EUV reflective mask 106. The extreme ultraviolet reflective element production system 200 produces mask blanks, mirrors, or other elements that reflect the extreme ultraviolet light 112 of FIG. 2. The extreme ultraviolet reflective element production system 200 fabricates the reflective elements by applying thin coatings to source substrates 203.

The EUV mask blank 204 is a multilayered structure for forming the EUV reflective mask 106 of FIG. 2. The EUV mask blank 204 is formed using semiconductor fabrication techniques. The EUV reflective mask 106 has the mask pattern 114 of FIG. 2 formed on the EUV mask blank 204 by etching and other processes. The extreme ultraviolet mirror 205 is a multilayered structure reflective in a range of extreme ultraviolet light. The extreme ultraviolet mirror 205 is formed using semiconductor fabrication techniques. The EUV mask blank 204 and the extreme ultraviolet mirror 205 are, in some embodiments, similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112. The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system can have any number of vacuum chambers.

The wafer handling vacuum chamber 208 has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, are used in some embodiments to form thin films of conductive materials on the source substrates 203. For example, the physical vapor deposition systems of some embodiments include a vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

In one or more embodiments, the physical vapor deposition system forms reflective layers, capping layers, and absorber layers. For example, the physical vapor deposition systems are configured to form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. According to one or more embodiments, the physical vapor deposition systems are configured to form layers of a first film comprising silicon (Si), boron (B), yttrium (Y), barium (Ba) and zirconium (Zr), a second film comprising an element selected from the group consisting of ruthenium (Ru), palladium (Pd), iridium (Ir), platinum (Pt) and gold (Au), and a third film comprising a metal selected from the group consisting of molybdenum (Mo), niobium (Nb), tungsten (W), manganese (Mn) and titanium (Ti) as described with respect to FIGS. 4 and 5. Although some compounds are described as an oxide, it is understood that the compounds include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 are in a separate system from the extreme ultraviolet reflective element production system 200.

The chemical vapor deposition system 228 forms thin films of material on the source substrates 203. For example, the chemical vapor deposition system 228 is used to form layers of materials on the source substrates 203 including mono-crystalline layers, polycrystalline layers, amorphous layers, epitaxial layers, or a combination thereof. The chemical vapor deposition system 228 forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 transfers the source substrates 203 and the EUV mask blank 204 between the first wafer handling system 214, the second wafer handling system 216 in a continuous vacuum.

Some embodiments of the disclose provide methods of forming extreme ultraviolet (EUV) mask blanks. The methods comprise forming a multilayer reflective stack on a substrate. In one or more embodiments, the multilayer reflective stack comprises a trilayer film comprising a first film, a second film, and a third film. Some methods further comprise forming an interface layer on one or more of the first film, the second film and the third film. Some methods comprise forming a capping layer on the multilayer reflective stack and forming an absorber layer on the capping layer. Methods of forming extreme ultraviolet (EUV) mask blanks may be described with reference to embodiments of EUV mask blanks illustrated in one or more of FIG. 4 and FIG. 5. FIG. 5 illustrates an embodiment of an extreme ultraviolet reflective element 300 of FIG. 4, further comprising one or more interface layers 325, 335, 345 to form an extreme ultraviolet reflective element 400 having a multilayer reflective stack 380.

Figure 4:
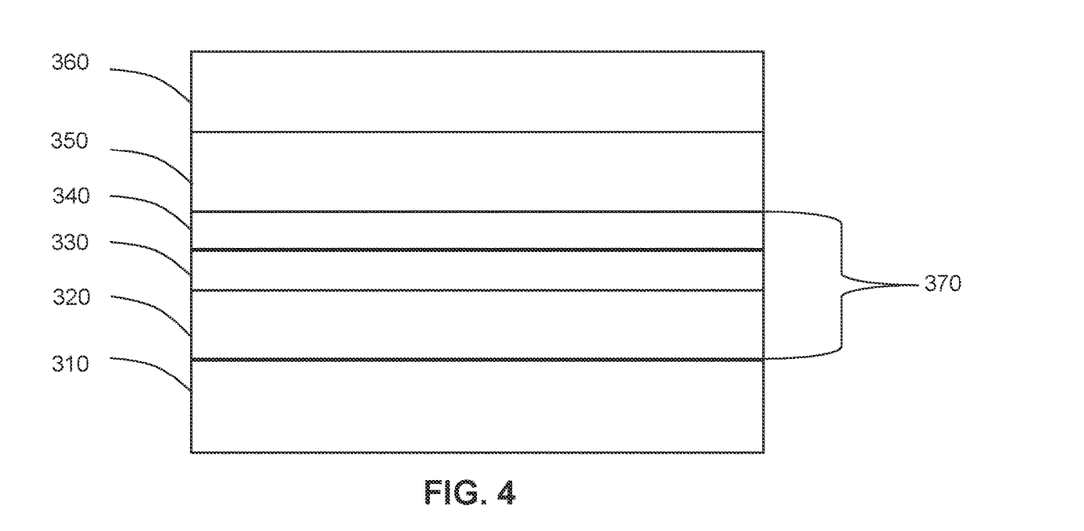
FIG. 4 illustrates an embodiment of an extreme ultraviolet reflective element, such as an EUV mask blank, having a multilayer reflective stack comprising a trilayer film.
Figure 5:
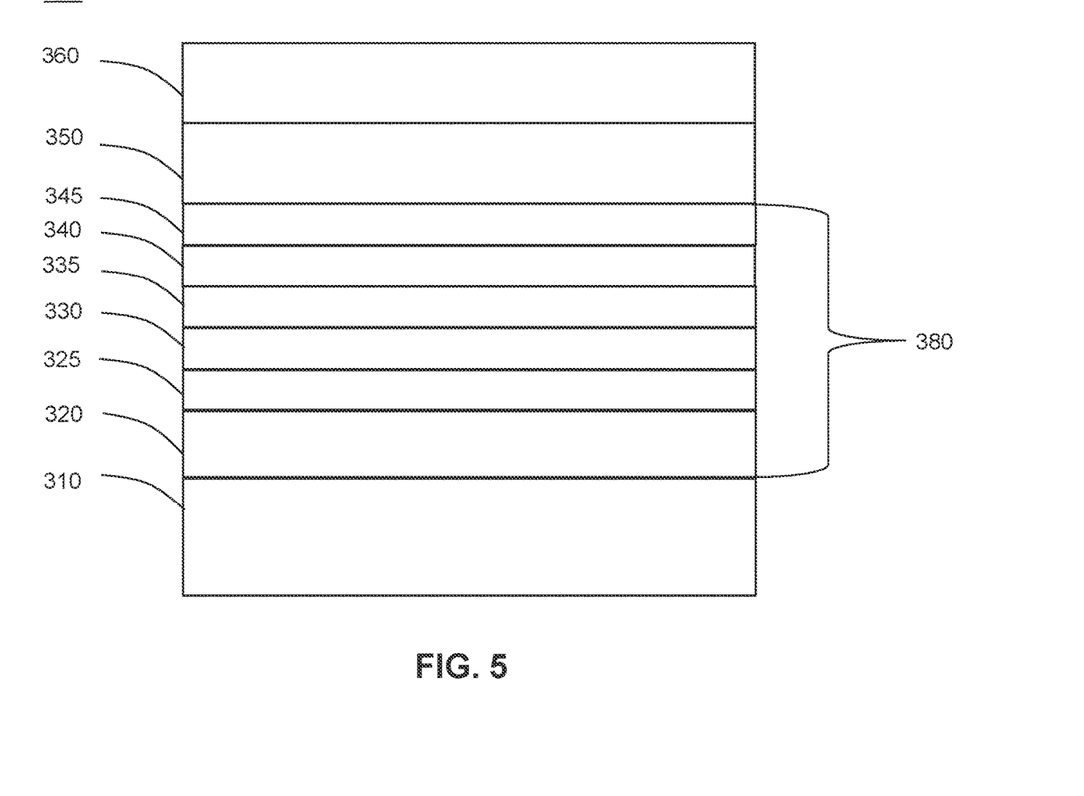
FIG. 5 illustrates the EUV mask blank of FIG. 4 having an interface layer between each film of the trilayer film.

Referring now to FIG. 4, an embodiment of an extreme ultraviolet reflective element 300, such as the EUV mask blank 204 of FIG. 3 or the extreme ultraviolet mirror 205 of FIG. 3, is shown. The EUV mask blank 204 and the extreme ultraviolet mirror 205 are structures for reflecting the extreme ultraviolet light 112 of FIG. 2. The EUV mask blank 204 is used to form the EUV reflective mask 106 shown in FIG. 2.

As used in this specification and the appended claims, the term for the EUV mask blank 204 is used interchangeably with the term of the extreme ultraviolet mirror 205 for simplicity. In one or more embodiments, the EUV mask blank 204 includes the components of the extreme ultraviolet mirror 205 with the absorber layer 380 added in addition to form the mask pattern 114 of FIG. 2.

The EUV mask blank 204 is an optically flat structure used for forming the EUV reflective mask 106 having the mask pattern 114. In one or more embodiments, the reflective surface of the EUV mask blank 204 forms a flat focal plane for reflecting the incident light, such as the extreme ultraviolet light 112 of FIG. 2.

The extreme ultraviolet reflective element 300 includes a substrate 310, a multilayer reflective stack 370 on the substrate 310. The multilayer reflective stack 370 comprising a trilayer film including a first film 320, a second film 330 and a third film 340. In one or more embodiments, extreme ultraviolet mirror 205 is used to form reflecting structures for use in the condenser 104 of FIG. 2 or the optical reduction assembly 108 of FIG. 2. The embodiment illustrated in FIG. 4 includes the extreme ultraviolet reflective element 300 having a substrate 310, a multilayer reflective stack 370 on the substrate 310, the multilayer reflective stack 370 comprising a trilayer film including a first film 320, a second film 330 and a third film 340, a capping layer 350 on the multilayer reflective stack 370, and an absorber layer 360 on the capping layer 350.

The substrate 310 is an element for providing structural support to the extreme ultraviolet reflective element 300. In one or more embodiments, the substrate 310 is made from a material having a low coefficient of thermal expansion (CTE) to provide stability during temperature changes. In one or more embodiments, the substrate 310 has properties such as stability against mechanical cycling, thermal cycling, crystal formation, or a combination thereof. The substrate 310 according to one or more embodiments is formed from a material such as silicon, glass, oxides, ceramics, glass ceramics, or a combination thereof.

Because most materials absorb light at extreme ultraviolet wavelengths, the optical elements used are reflective instead of the transmissive as used in other lithography systems. A multilayer reflective stack 370 forms a reflective structure by having alternating thin layers of materials with different optical properties to create a Bragg reflector or mirror.

In one or more embodiments, the multilayer reflective stack 370 is a structure that is reflective to the extreme ultraviolet light 112. In one or more embodiments, the multilayer reflective stack 370 comprises a plurality of groups of alternating layers comprising a trilayer film having a first film 320, a second film 330, and a third film 340. The first film 320, the second film 330, and the third film 340 can have a variety of structures. In an embodiment, each of the first film 320, the second film 330 and the third film 340 are formed with a single layer, multiple layers, a divided layer structure, non-uniform structures, or a combination thereof.

In one or more embodiments, the first film 320, the second film 330, and the third film 340 of the multilayer reflective stack 370 form a reflective group. As used in this specification and the appended claims, the terms "reflective group" and "plurality of group of alternating films" and "plurality of group of alternating layers" may be used interchangeably to refer to one or more reflective layers. In a non-limiting embodiment, the multilayer reflective stack 370 includes a range of 20-60 of the reflective groups for a total of up to 180 reflective layers. In another non-limiting embodiment, the multilayer reflective stack 370 includes 20 of the reflective groups for a total of 60 reflective layers. In another non-limiting embodiment, the multilayer reflective stack 370 includes 10 of the reflective groups for a total of 30 reflective layers.

The multilayer reflective stack 370 is formed in a variety of ways. In an embodiment, the first film 320, the second film 330, and the third film 340 are formed with magnetron sputtering, ion sputtering systems, pulsed laser deposition, cathode arc deposition, or a combination thereof.

In an illustrative embodiment, the multilayer reflective stack 370 is formed using a physical vapor deposition technique, such as magnetron sputtering. In an embodiment, the first film 320, the second film 330, and the third film 340 of the multilayer reflective stack 370 have the characteristics of being formed by the magnetron sputtering technique including precise thickness, low roughness, and clean interfaces between the layers. In an embodiment, the first film 320, the second film 330, and the third film 340 of the multilayer reflective stack 370 have the characteristics of being formed by the physical vapor deposition including precise thickness, low roughness, and clean interfaces between the layers.

In an embodiment, each of the first film 320, the second film 330, and the third film 340 has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the first film 320, the second film 330, and the third film 340 are each about 4.33 nm thick. It is understood that the sizes and dimensions provided are within normal engineering tolerances for typical elements.

The physical dimensions of the layers of the multilayer reflective stack 370 formed using the physical vapor deposition technique are precisely controlled to increase reflectivity. The thickness of the layers dictates the peak reflectivity wavelength of the extreme ultraviolet reflective element. If the thickness of the layers is incorrect, the reflectivity at the desired wavelength 13.5 nm is reduced.

In one or more embodiments, the first film 320 comprises an element selected from the group consisting of silicon (Si), boron (B), yttrium (Y), barium (Ba) and zirconium (Zr). In one or more embodiments, the first film 320 has a thickness in a range of from 2.5 nm to 6.5 nm, in a range of from 3.0 nm to 5 nm, or in a range of from 3.5 nm to 4.5 nm.

In one or more embodiments, the second film 330 comprises an element selected from the group consisting of ruthenium (Ru), palladium (Pd), iridium (Ir), platinum (Pt) and gold (Au). In one or more embodiments, the second film 330 has a thickness in a range of from 0.5 nm to 2.5 nm, in a range of from 0.5 nm to 2.0 nm, or in a range of from 0.5 nm to 1.5 nm.

In one or more embodiments, the third film 340 comprises a metal selected from the group consisting of molybdenum (Mo), niobium (Nb), tungsten (W), manganese (Mn) and titanium (Ti). In one or more embodiments, the third film 340 has a thickness in a range of from 0.5 nm to 2.5 nm, in a range of from 0.5 nm to 2.0 nm, or in a range of from 0.5 nm to 1.5 nm. In one or more embodiments, the second film 330 and the third film 340 have the same thickness. In one or more embodiments, the second film 330 and the third film 340 have different thicknesses.

In one or more embodiments, the multilayer reflective stack 370 has a greater reflectance than a multilayer reflective stack without the third film 340. In one or more embodiments, the multilayer reflective stack 370 has a reflectance of at least about 62%. In one or more embodiments, the multilayer reflective stack 370 has a reflectance in a range of about 60% to about 72% at a wavelength of 13.5 nm. In one or more embodiments, the multilayer reflective stack 370 has a reflectance in a range of about 62% to about 70%, or in a range of about 62% to about 66% at wavelength of 13.5 nm. In one or more embodiments, a multilayer reflective stack without the third film 340 has a reflectance of less than about 60%.

In one or more embodiments, the multilayer reflective stack 370 has a broader bandwidth than a multilayer reflective stack without the third film 340. In one or more embodiments, bandwidth is measured at a distance between two adjacent 50% edge points, i.e., a full-width at half-maximum (FWHM) of a reflectance spectrum as a function of wavelength. In one or more embodiments, the FWHM of the multilayer reflective stack 370 having the third film 340 is in a range of from 0.75 nm to 0.85 nm. In one or more embodiments, the FWHM of a multilayer reflective stack without the third film 340 is in a range of from 0.55 nm to 0.70 nm.

In one or more embodiments, the multilayer reflective stack 370 has a reduced double scattering effect compared to a multilayer reflective stack without the third film 340. As used in this specification and the appended claims, the terms "double diffraction effect", "double scattering effect" and "mask 3D (M3D) effect" may be used interchangeably to refer to the Z-effect ($Z_{eff}$).

In one or more embodiments, the multilayer reflective stack 370 has a lower Z-effect ($Z_{eff}$) than a multilayer reflective stack without the third film 340. In one or more embodiments, $Z_{eff}$ refers to a distance away from an absorber layer. In one or more embodiments, lower $Z_{eff}$ means that the distance away from an absorber layer is relatively lower. Therefore, the distance between the multilayer reflection plane and the absorber layer in a patterned EUV mask blank is also relatively lower. It has been advantageously found that obtaining a lower $Z_{eff}$ reduces the double scattering effect and results in improved lithography yield. In one or more embodiments, the absorber layer 360 is on or directly on the multilayer reflective stack 370. In one or more embodiments, when the absorber layer 360 is on or directly on the multilayer reflective stack 370, the $Z_{eff}$ is in a range of from 30 nm to 45 nm. In one or more embodiments, the $Z_{eff}$ in a multilayer reflective stack without the third film 340 is in a range of 50 nm to 60 nm.

Referring to FIGS. 4 and 5, the capping layer 350 is formed from a variety of materials having a hardness sufficient to resist erosion during cleaning. In one embodiment, ruthenium (Ru) is used as a capping layer material because it is a good etch stop and is relatively inert under the operating conditions. However, it is understood that in some embodiments, other materials are used to form the capping layer 350. In one or more embodiments, the capping layer 350 has a thickness in a range of from 2 nm to 5 nm, in a range of from 2.5 nm to 4 nm, or in a range of from 2.5 nm to 3 nm.

In one or more embodiments, forming the capping layer 350 over the multilayer reflective stack 370 formed with harder materials improves reflectance. In some embodiments, increased reflectance is achieved using low roughness layers, clean interfaces between layers, improved layer materials, or a combination thereof.

In one or more embodiments, the capping layer 350 is a protective layer allowing the transmission of the extreme ultraviolet light 112. In one or more embodiments, the capping layer 350 is formed directly on the multilayer reflective stack 370. In one or more embodiments, the capping layer 350 protects the multilayer reflective stack 370 from contaminants and mechanical damage. In one embodiment, the multilayer reflective stack 370 is sensitive to contamination by oxygen, carbon, hydrocarbons, or a combination thereof. The capping layer 350 according to an embodiment interacts with the contaminants to neutralize them.

In one or more embodiments, the capping layer 350 is an optically uniform structure that is transparent to the extreme ultraviolet light 112. The extreme ultraviolet light 112 passes through the capping layer 350 to reflect off of the multilayer reflective stack 370. In one or more embodiments, the capping layer 350 has a total reflectivity loss of 1% to 2%. In one or more embodiments, each of the different materials has a different reflectivity loss depending on thickness, but all of them will be in a range of 1% to 2%.

In one or more embodiments, the capping layer 350 has a smooth surface. For example, the surface of the capping layer 350 in some embodiments has a roughness of less than 0.2 nm RMS (root mean square measure). In another example, the surface of the capping layer 350 has a roughness of 0.08 nm RMS for a length in a range of 1/100 nm and 1/1 μm. The RMS roughness will vary depending on the range it is measured over. For the specific range of 100 nm to 1 micron, roughness is 0.08 nm or less.

The capping layer 350 is formed by a variety of methods. In an embodiment, the capping layer 350 is formed on or directly on the multilayer reflective stack 370 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 350 has the physical characteristics of being formed by the magnetron sputtering technique including precise thickness, low roughness, and clean interfaces between the layers. In an embodiment, the capping layer 350 has the physical characteristics of being formed by the physical vapor deposition including precise thickness, low roughness, and clean interfaces between the layers. In one or more embodiments, the capping layer 350 is formed on or directly on the multilayer reflective stack 370 using any of the methods described herein.

Referring again to FIGS. 4 and 5, the absorber layer 360 is formed on or directly on the capping layer 350. In one or more embodiments, the absorber layer 360 is on or directly on the multilayer reflective stack 370. The absorber layer 360 is a layer that absorbs the extreme ultraviolet light 112. The absorber layer 360 is used to form the pattern on the EUV reflective mask 106 by providing areas that do not reflect the extreme ultraviolet light 112. The absorber layer 360, according to one or more embodiments, comprises a material having a high absorption coefficient for a particular frequency of the extreme ultraviolet light 112, such as about 13.5 nm. In an embodiment, the absorber layer 360 is formed directly on the capping layer 350, and the absorber layer 360 is etched using a photolithography process to form the pattern of the EUV reflective mask 106.

According to one or more embodiments, forming the absorber layer 360 over the capping layer 350 increases reliability of the EUV reflective mask 106. The capping layer 360 acts as an etch stop layer for the absorber layer 360. When the mask pattern 114 of FIG. 2 is etched into the absorber layer 360, the capping layer 350 beneath the absorber layer 360 stops the etching action to protect the multilayer reflective stack 370. In one or more embodiments, the absorber layer 360 is etch selective to the capping layer 350. In some embodiments, the capping layer 350 comprises ruthenium, and the absorber layer 360 is etch selective to ruthenium.

In one or more embodiments, the absorber layer 360 has an "n" value of less than 0.92, which provides a range from about 180 degrees to about 220 degrees phase shift. The "n" value of less than about 0.92 improves the normalized image log slope (NILS) and mitigates 3D effects. As used in the specification and appended claims, "normalized image log slope (NILS)" refers to a metric describing the lithographic quality of an aerial image. As used in the specification and appended claims, "n" or "n value" refers to an index of refraction. The index of refraction is a measurement of the bending of a ray of light when passing from one medium into another. The low "n" value improves the NILS and mitigates 3D effects.

In an embodiment, the absorber layer 360 has a thickness of less than about 55 nm, including less than about 50 nm, less than about 45 nm, less than about 40 nm, less than about 35 nm, less than about 30 nm, less than about 25 nm, less than about 20 nm, less than about 15 nm, less than about 10 nm, less than about 5 nm, less than about 1 nm, or less than about 0.5 nm. In other embodiments, the absorber layer 360 has a thickness in a range of about 0.5 nm to about 55 nm, including a range of about 1 nm to about 54 nm, 1 nm to about 50 nm, and 15 nm to about 50 nm.

Referring now to FIG. 5, an extreme ultraviolet reflective element 400 having an interface layer 325, 335, 345 between each of the first film 320, the second film 330, the third film 340, and the capping layer 350, and the absorber layer 360 on the capping layer 350 is shown. In one or more embodiments, the multilayer reflective stack 380 comprises an interface layer 325, 335, 345 on one or more of the first film 320, the second film 330, and the third film 340.

In one or more embodiments, the interface layers 325, 335, 345 are the same. In one or more embodiments, each of the interface layers 325, 335, 345 are different. In one or more embodiments, the interface layer 325, 335, 345 comprises one or more of silicon nitride ($Si_xN_y$), silicon carbide ($Si_xC_y$), boron nitride ($B_xN_y$), boron carbide ($B_xC_y$), aluminum nitride ($Al_xN_y$), aluminum silicide ($Al_xSi_y$), molybdenum silicide ($Mo_xSi_y$), ruthenium silicide ($Ru_xSi_y$), molybdenum nitride ($Mo_xN_y$), and ruthenium nitride ($Ru_xN_y$). In one or more embodiments, the at least one interface layer 325, 335, 345 has a thickness in a range of from 0.5 nm to 1.5 nm, in a range of from 0.5 nm to 1.2 nm, or in a range of from 0.8 nm to 1.2 nm.

It has been advantageously found that EUV mask blanks described herein may be configured for use in a high numerical aperture (high-NA) EUV scanner. Without intending to be bound by theory, typical EUV scanners include a 0.33 NA lens, whereas "high-NA" EUV scanners include a 0.55 NA lens. High-NA EUV scanners advantageously avoid producing mask splits that occur in scanners including a 0.33 NA lens, eliminate the cumulative edge placement errors (EPE) for mask splits, reduce process complexity and lower costs. When the cumulative EPE for mask splits is eliminated, the yield of the EUV lithography step will be high.

It has been discovered that the EUV mask blanks described herein have low $Z_{eff}$ and high reflectance over large bandwidth of reflection angle, which minimizes M3D effects. Reducing M3D effects is believed to increase yield when used in an EUV lithography system of the type shown in FIG. 2. Embodiments of the disclosure advantageously provide EUV mask blanks having high throughput due to increased reflectance. As used in this specification and appended claims, "throughput" refers to the number of processed samples per unit time.

Figure 6:
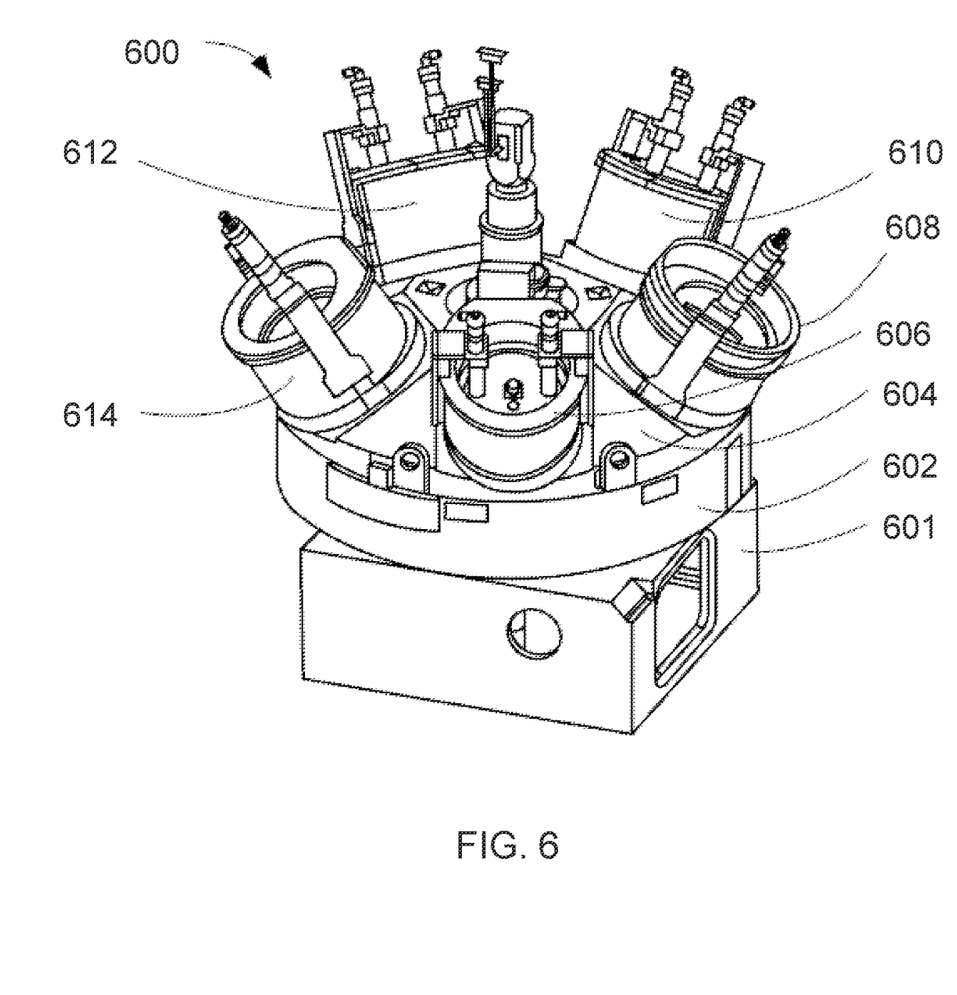
FIG. 6 illustrates an embodiment of a multi-cathode physical deposition chamber.

Referring now to FIG. 6, an upper portion of a multi-cathode source chamber 600 is shown in accordance with an embodiment. The multi-cathode chamber 600 includes a base structure 601 with a cylindrical body portion 602 capped by a top adapter 604. The top adapter 604 has provisions for a number of cathode sources, such as cathode sources 606, 608, 610, 612, and 614, positioned around the top adapter 604. The cathode sources 606, 608, 610, 612, and 614 according to one or more embodiments comprise different materials as described herein to form the multilayer reflective stack comprising the trilayer film, the interface layers, the capping layer, and the absorber layer.

In some embodiments, the multi-cathode source chamber 600 is part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer reflective stack on the substrate, the multilayer reflective stack including a comprising a trilayer film, an optional interface layer between one or more films of the trilayer film, a capping layer on the multilayer reflective stack, and an absorber layer on the capping layer. The system is used to make the EUV mask blanks shown with respect to FIG. 4 or FIG. 5 and have any of the properties described with respect to the EUV mask blanks described with respect to FIGS. 4-5.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely exemplary. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising: a multilayer reflective stack on a substrate, the multilayer reflective stack comprising a trilayer film comprising a first film comprising an element selected from the group consisting of silicon (Si), boron (B), yttrium (Y), barium (Ba) and zirconium (Zr), a second film comprising an element selected from the group consisting of ruthenium (Ru), palladium (Pd), iridium (Ir), platinum (Pt) and gold (Au), and a third film comprising a metal selected from the group consisting of molybdenum (Mo), niobium (Nb), tungsten (W), manganese (Mn) and titanium (Ti).

2. The EUV mask blank of claim 1, wherein the first film has a thickness in a range of from 2.5 nm to 6.5 nm.

3. The EUV mask blank of claim 1, wherein each of the second film and the third film has a thickness in a range of from 0.5 nm to 2.5 nm.

4. The EUV mask blank of claim 1, wherein the multilayer reflective stack has a greater reflectance than a multilayer reflective stack without the third film.

5. The EUV mask blank of claim 4, wherein the multilayer reflective stack has a reflectance in a range of about 60% to about 72% at a wavelength of 13.5 nm.

6. The EUV mask blank of claim 1, wherein the multilayer reflective stack has a broader bandwidth than a multilayer reflective stack without the third film.

7. The EUV mask blank of claim 1, wherein the multilayer reflective stack has a reduced double scattering effect compared to a multilayer reflective stack without the third film.

8. The EUV mask blank of claim 1, wherein the multilayer reflective stack has a lower Z-effect ($Z_{eff}$) than a multilayer reflective stack without the third film.

9. The EUV mask blank of claim 1, further comprising an interface layer on one or more of the first film, the second film, and the third film.

10. The EUV mask blank of claim 9, wherein the interface layer comprises one or more of silicon nitride ($Si_xN_y$), silicon carbide ($Si_xC_y$), boron nitride ($B_xN_y$), boron carbide ($B_xC_y$), aluminum nitride ($Al_xN_y$), aluminum silicide ($Al_xSi_y$), molybdenum silicide ($Mo_xSi_y$), ruthenium silicide ($Ru_xSi_y$), molybdenum nitride ($Mo_xN_y$), and ruthenium nitride ($Ru_xN_y$).

11. The EUV mask blank of claim 9, wherein the interface layer has a thickness in a range of from 0.5 nm to 1.5 nm.

12. An extreme ultraviolet (EUV) mask blank comprising:
a multilayer reflective stack on a substrate, the multilayer reflective stack comprising a trilayer film comprising a first film comprising an element selected from the group consisting of silicon (Si), boron (B), yttrium (Y), barium (Ba) and zirconium (Zr), a second film comprising an element selected from the group consisting of ruthenium (Ru), palladium (Pd), iridium (Ir), platinum (Pt) and gold (Au), and a third film comprising a metal selected from the group consisting of molybdenum (Mo), niobium (Nb), tungsten (W), manganese (Mn) and titanium (Ti); and
an interface layer on one or more of the first film, the second film, and the third film, the interface layer comprising one or more of silicon nitride ($Si_xN_y$), silicon carbide ($Si_xC_y$), boron nitride ($B_xN_y$), boron carbide ($B_xC_y$), aluminum nitride ($Al_xN_y$), aluminum silicide ($Al_xSi_y$), molybdenum silicide ($Mo_xSi_y$), ruthenium silicide ($Ru_xSi_y$), molybdenum nitride ($Mo_xN_y$), and ruthenium nitride ($Ru_xN_y$).

13. The EUV mask blank of claim 12, wherein the first film has a thickness in a range of from 2.5 nm to 6.5 nm.

14. The EUV mask blank of claim 12, wherein each of the second film and the third film has a thickness in a range of from 0.5 nm to 2.5 nm.

15. The EUV mask blank of claim 12, wherein the multilayer reflective stack has a reflectance in a range of about 60% to about 72% at a wavelength of 13.5 nm.

16. The EUV mask blank of claim 12, wherein the multilayer reflective stack has a broader bandwidth than a multilayer reflective stack without the third film.

17. The EUV mask blank of claim 12, wherein the multilayer reflective stack has a reduced double scattering effect compared to a multilayer reflective stack without the third film.

18. The EUV mask blank of claim 12, wherein the multilayer reflective stack has a lower Z-effect ($Z_{eff}$) than a multilayer reflective stack without the third film.

19. The EUV mask blank of claim 12, wherein the interface layer has a thickness in a range of from 0.5 nm to 1.5 nm.

20. The EUV mask blank of claim 12, wherein the EUV mask blank is configured for use in a high numerical aperture (high-NA) EUV scanner.

* * * * *